United States Patent [19]

Fuse et al.

[11] Patent Number: 5,118,029
[45] Date of Patent: Jun. 2, 1992

[54] METHOD OF FORMING A SOLDER LAYER ON PADS OF A CIRCUIT BOARD AND METHOD OF MOUNTING AN ELECTRONIC PART ON A CIRCUIT BOARD

[75] Inventors: Kenichi Fuse, Hadano; Takao Fukunaga, Hiratsuka; Masanao Kohno, Kakogawa; Hisao Irie, Takasago, all of Japan

[73] Assignees: The Furukawa Electric Co., Ltd., Tokyo; Harima Chemicals, Inc., Hyogo, both of Japan

[21] Appl. No.: 618,031

[22] Filed: Nov. 26, 1990

[30] Foreign Application Priority Data

Nov. 30, 1989 [JP] Japan .................... 1-309056
Nov. 30, 1989 [JP] Japan .................... 1-309057
Aug. 27, 1990 [JP] Japan .................... 2-222627

[51] Int. Cl.$^5$ .............................. B23K 00/00
[52] U.S. Cl. ...................... 228/198; 228/180.2; 228/224; 228/248; 427/259
[58] Field of Search ............ 228/198, 180.2, 248, 228/224; 427/259

[56] References Cited

U.S. PATENT DOCUMENTS

| | | | |
|---|---|---|---|
| 3,978,378 | 8/1976 | Tigner et al. | 317/258 |
| 4,132,341 | 1/1979 | Bratschum | 228/224 X |
| 4,293,592 | 10/1981 | Morishita | 427/259 X |
| 4,490,283 | 12/1984 | Kleiner | 252/512 |
| 4,661,173 | 4/1987 | Barajas | 148/24 |
| 4,728,023 | 3/1988 | Barajas | 228/242 X |
| 4,810,672 | 3/1989 | Schwarzbauer | 228/248 X |
| 4,851,153 | 7/1989 | Kono et al. | 252/518 |
| 4,960,236 | 10/1990 | Hedges | 228/248 X |
| 5,021,269 | 6/1991 | Kono et al. | 427/436 |

FOREIGN PATENT DOCUMENTS 63-114979 5/1983 Japan .
62-227593 10/1987 Japan .
1-157796 6/1989 Japan .

*Primary Examiner*—Kurt Rowan
*Assistant Examiner*—Patty E. Hong
*Attorney, Agent, or Firm*—Frishauf, Holtz, Goodman & Woodward

[57] ABSTRACT

A paste-like composition containing a lead salt of an organic acid and tin powder is applied on a pad array portion of a circuit board. Then, the paste-like compsition is heated so as to cause precipitation, thereby forming a solder layer formed of a Sn-Pb alloy substantially only on the pads. This precipitation is performed in a state that a liquid pool is formed on the pad array portion when the paste-like composition is liquefied by heating, and the tin powder is settled in the liquid pool. When an electronic part is mounted on the pads, first, preparatory solder layers are formed on the pads by the above-mentioned precipitation process. After a paste-like composition is applied on the preparatory solder layers, the electronic part is put on the paste-like composition. Then, the paste-like composition is heated, thereby soldering leads of the electronic part to the pads.

29 Claims, 2 Drawing Sheets

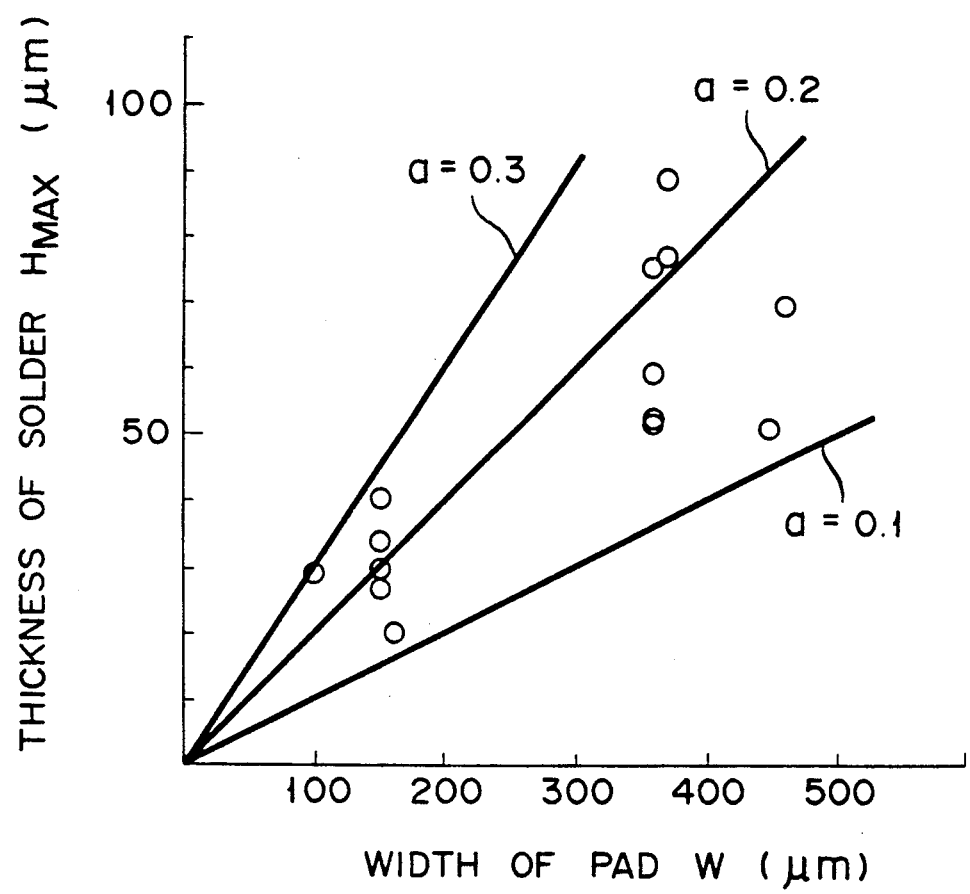
F I G. 3

METHOD OF FORMING A SOLDER LAYER ON PADS OF A CIRCUIT BOARD AND METHOD OF MOUNTING AN ELECTRONIC PART ON A CIRCUIT BOARD

BACKGROUND OF THE INVENTION

1. Field of the Invention

This invention relates to a method of forming a solder layer on pads of a circuit board, and also a method of mounting electronic parts on a circuit board.

2. Description of the Related Art

In general, before mounting electronic parts on a circuit board, a thin solder layer is formed on pads of the circuit board to prevent the pads from being oxidized and to improve the wettability of solder used in mounting elements. The thin solder layer is formed by a hot gas leveling method, an electroplating method, or the like.

In the hot gas leveling method, first, a circuit board is dipped in melted solder to apply the folder to a pad array formed on the board. After drawing up the board from the melted solder, a hot gas is sprayed on the board before the solder is hardened, thereby bowing off superfluous solder from the pads and the gap between adjacent pads. As a result, thin solder layers are formed on the pads only.

This method is disadvantageous in that it is difficult to form a solder layer having a uniform thickness. The thickness of a solder layer tends to vary widely. Particularly, if the pitch of the pads is fine bridging (conduction between the pads through the solder) occurs easily. To avoid bridging, it is necessary to form a thin solder layer. However, if a portion having a thickness of 1 μm or less is generated due to variety of the thickness of a solder layer, an intermetallic compound layer such as $Cu_3Sn$ formed between copper pads and the solder layer may be exposed, and the surface of the solder layer may be oxidized. Hence, the wettability of solder is greatly reduced at the time of mounting parts in a next step.

On the other hand, the electroplating method is advantageous in that a solder layer can be formed on a fine pattern. However, it is necessary to heat and melt the solder layer after the electroplating, since an intermetallic compound layer for adhering copper foil of the pads with the solder layer is not formed. In the heating step, the blister of the resist of the circuit board and the above-mentioned bridging tend to occur. Moreover, the manufacturing cost is twice that required in the hot gas leveling method.

When electronic parts are to be mounted on both sides of a circuit board, first, solder layers are formed on pads of both sides, and then parts are mounted on one side thereafter on another side (it is impossible to mount parts on both sides simultaneously). When parts are mounted to the solder layer on a first side, the solder layer on a second side on which parts are to be mounted later is heated to a high temperature in a reflow furnace process. At this time, if the solder layer on the second side is where the thickness is too thin, an intermetallic compound layer may be exposed then, oxidation occurs at the portion, and the wettability of the solder layer tends to reduced.

Therefore, a method of forming a preparatory solder layer having a relatively large thickness uniformly is demanded.

In recent years, the lead pitches of electronic parts have been reduced to 0.8 mm, 0.65 mm, or 0.5 mm in order to make the electronic device lighter, thinner, and more compact. Electronic parts having the lead pitches of 0.36 mm, 0.3 mm, or 0.15 mm have been devised. The conventional methods such as printing of applying a soldering paste on each pad can be applied to a part of a lead pitch of about 0.5 mm or larger. However, it is very difficult to supply a soldering paste in a proper quantity on a individual pad. If the quantity of a soldering paste is too much, bridging tends to be formed between adjacent pads. On the other hand, if the quantity of a soldering paste is too little, it is impossible to mount a part on a circuit board.

Hence, it is demanded that a part mounting method which can be applied to a part having leads of a fine pitch be developed.

SUMMARY OF THE INVENTION

An object of the present invention is to provide a method of forming a solder layer having a relatively large thickness such that an intermetallic compound will not be exposed even if the solder layer is heated, on pads (The term "pads of a circuit board, uniformly" used here is a general term for the part-mounting portion, which includes, for example, the through hole to which the parts are mounted. The term "pads" hereinafter is used to mean the above.)

Another object of the present invention is to provide a method of mounting a part on a circuit board which can be applied in mounting an electronic part having leads of a fine pitch.

According to the present invention, there is provided a method of forming a solder layer on pads of a circuit board, comprising the steps of: applying a paste-like composition containing a lead salt of an organic acid and tin powder on a pad array portion of a circuit board; and heating the composition to cause solder precipitation, thereby forming solder layers formed of a Sn-Pb alloy substantially only on pads, the precipitation being performed in a state that a liquid pool is formed on the pad array portion when the paste-like composition is liquefied by heating, and the tin powder is settled in the liquid pool.

There is also provided a method of mounting a electronic part on a circuit board, comprising the steps of: forming a preparatory solder layer made of an Sn-Pb alloy substantially only on pads of the circuit board; applying a paste-like composition containing a lead salt of an organic acid and tin powder on the preparatory solder layer; putting an electronic part on the paste-like composition; and heating the composition to cause solder precipitation, thereby soldering the pads with leads of the electronic part There is further provided a method of mounting an electronic part on a circuit board, comprising the steps of: applying a paste-like composition containing a lead salt of an organic acid and tin powder on a pad array portion on the circuit board; heating the paste-like composition to cause solder precipitation, thereby forming solder layers formed of an Sn-Pb alloy by an amount required for mounting an electronic part on pads of the pad array portion; applying a flux on either the solder layers or leads of the electronic part which are to be mounted on the pads; putting an electronic part on the pads; and heating the solder layers and soldering the pads with leads of the electronic part.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrates presently preferred embodiments of the invention and, together with the general description given above and the detailed description of the preferred embodiments given below, serves to explain the principles of the invention.

FIG. 3 is a graph showing a relationship between a width of pad and a thickness of a solder layer precipitated thereon.

DETAILED DESCRIPTION OF THE PREFERRED EMBODIMENTS

Figure 1:
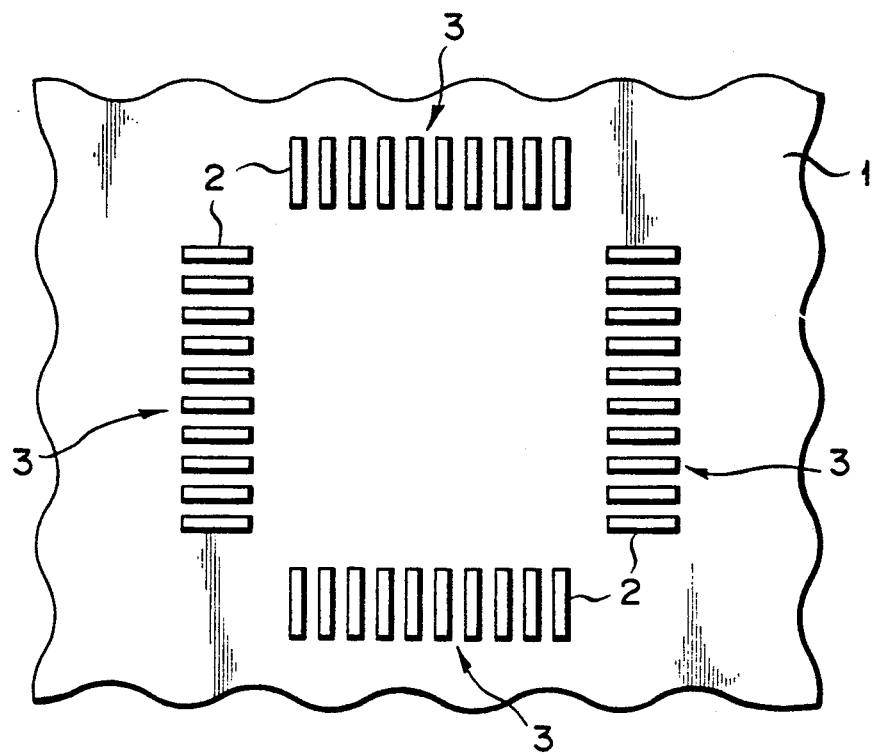
FIG. 1 is a plan view showing a part of a circuit board using in the present invention.

The present inventors have proposed a method of precipitating solder formed of a Sn-Pb alloy on pads only (Published Unexamined Japanese Patent Application No. 1-157796. In the method, a paste-like composition containing a lead salt of an organic acid and tin powder on a pad array on a circuit board, and heating the composition. As a result, a Sn-Pb solder is precipitated substantially only on pads.

The method of forming a solder layer according to the present invention is based on the above-mentioned method of precipitating solder, and characterized in that the state of a paste-like composition for use in precipitating solder is defined More specifically, when the paste-like composition is heated and liquefied due to the heat, a liquid pool in which tin powder is settled is formed on a pad array portion, and the precipitation of solder is performed in a state that the tin powder is settled in the liquid, that is, the powder is covered by the liquid.

According to the method of the invention, a relatively thick solder layer is formed uniformly on a fine pattern of a pad pitch of 0.5 mm or smaller. This method was first devised by the present inventors as a result of their research.

In general, when a solder layer is formed by applying melted solder on pads of a circuit board, a layer of a compound formed of Cu and Sn (an intermetallic compound such as $Cu_3Sn$, or $Cu_6Sn_5$) is formed to a thickness of 1 to 2 $\mu m$ on the surface of the pads made of copper foil. Hence, to prevent the compound layer from being exposed, it is desirable that the solder layer be 5 $\mu m$ thick or more.

In contrast to the conventional method in which a solder layer is formed by remelting a Sn-Pb alloy, the method of the invention is based on the following principles: in a high temperature solution containing tin powder and a lead salt of an organic acid, Sn and Pb are replaced with each other due to an ionization level difference between Pb and Sn, thereby precipitating Pb; and the precipitated Pb and tin powder are melted in atomic level, thereby constituting a Sn-Pb alloy. Remelting of a conventional cream solder used in general occurs instantaneously as the temperature rises, and the melted solder is swelled due to surface tension. According to the present invention, since the precipitation reaction requires a relatively long period of time, and therefore solder is precipitated gradually, a solder layer having a uniform thickness can be formed.

The solder precipitating composition mainly comprises a lead salt of an organic acid and tin powder for forming a solder alloy, at least one kind of rosins and amines, and a viscosity modifier for keeping the blend in a paste state. These materials are kneaded thereby forming a paste in room temperature. The paste is applied on the pad array portion of a circuit board by solid-applying, and heated, thereby precipitating solder substantially only on pads. It is important for this process that liquid pool in which tin powder is settled is caused to be formed on the pad array portion when the paste is liquefied by heating, and precipitation is performed in a state that the tin powder is settled in the liquid, that is, the tin powder is covered by the liquid. The reason for this is as follows: when the paste is heated, the viscosity thereof is considerably reduced. When the viscosity is too low, the liquid extends in a wide range at the pad array portion and its neighborhood. As a result, the amount of the lead salt of the organic acid on the pads if not sufficient to react with the tin powder, and a sufficient amount of solder cannot be obtained A little extension is allowed. However, to form a -1 relatively thick solder layer (e.g., 5 $\mu m$) of a uniform thickness, it is necessary that a large amount of tin powder is settled on the pad array portion and kept covered with a melted liquid.

In the above-described process, Pb atoms separated from a lead salt of an organic acid by above-mentioned replacing reaction collide against the tin powder, thereby forming a Pb-Sn alloy. This is a mechanism of the solder precipitating. Hence, the occasion of the collision determines the amount of precipitated alloy. For this reason, it is desirable that the tin powder deposited on the pad array portion be entirely covered by the liquid containing a lead salt of an organic acid and rosins.

Next, the method of mounting an electronic part on pads will be described below.

The method is also based on the method disclosed in Published Unexamined Japanese Patent Application No. 1-157796. In the soldering step for mounting an electronic part on pads, the solder precipitating reaction disclosed in this reference is generated.

A first embodiment of the method comprises the steps of forming a preparatory solder layer made of a Sn-Pb alloy substantially only on pads, applying a paste-like composition containing a lead salt of an organic acid and tin powder on the preparatory solder layer, putting an electronic part on the preparatory solder layer applied the paste-like composition, and heating the paste-like composition to precipitate solder, thereby soldering leads of an electronic part on the pads.

As described before, in the conventional soldering method, a cream solder is remelted instantaneously as the temperature rises, and the solder is melted entirely in a shorter period of time than that required for the solder to extend over the pads. Hence, the melted solder is swelled due to surface tension. When the solder is swelled beyond the limit of the surface tension, it spreads out of the pads. Thus, bridging may occur on a fine pattern. Additionally, flux components of the soldering paste liquefy by heating and flow between pads.

At this time, solder particles flowing together with the flux component are melted in a moment, and this is a cause of bridging.

In contrast, the method of the present invention utilizes a solder precipitating reaction based on the following principles: in a high temperature solution containing tin powder and a lead salt of an organic acid, Sn and Pb are replaced with each other due to an ionization level difference between pb and Sn, thereby precipitating Pb; and the precipitated Pb and Sn are melted in atomic level, thereby constituting a Sn-Pb alloy. In this method, since it requires a long period of time to replace Sn with Pb, and to alloy every grain of the tin powder with precipitated Pb. Thus, the precipitation proceeds more gradually than above-mentioned conventional technique.

Further, since the precipitation reaction is performed in high temperature, the Sn-Pb alloy solder precipitated on pads immediately reacts with Cu of the pad material in the surface of the pads, thereby forming an intermetallic compound layer such as $Cu_3Sn$, $Cu_6Sn_5$, or the like.

Thereafter, a solder layer is formed on the intermetallic compound layer by the Sn-Pb alloy solder precipitated on the intermetallic compound layer, while the chemical bonding power is acted between the alloy solder and the intermetallic compound layer.

The greatest difference between this method and the conventional method is as follows: In the conventional soldering paste, solder particles are melted in a moment and at uniform time, thereby forming a solder layer. In contrast, in the present invention, fine solder particles having a variable period of time until precipitating as a solder on a pad is precipitated on a pad. Thereafter, the solder particles which are adjacent to each other diffuses into each other and are united, thereby forming a solder layer on a pad. That is, the solder layer is formed by a longer period of time than that in the conventional method.

Additionally, in the case of the present invention, since the precipitated solder particles have various compositions, the particles are hardly melted and united, unlike in the conventional method, even if solder particles precipitate between pads.

For above reason, according to the present invention, bridging between pads hardly occurs.

In addition, when the precipitated Pb collides against Sn powder existing near the pads or between adjacent pads, a Sn-Pb alloy is formed at that portion. The Sn-Pb alloy thus formed is drawn to and absorbed by the solder precipitated portion on the pads. In this way, the solder layer can be formed substantially only on pads of a fine pitch, e.g., 0.5 mm or less, without forming bridges.

It is desirable that the formation of the solder layer in the step of soldering an electronic part on pads is performed in the same manner as in the abovedescribed method of forming a solder layer according to the present invention. According to the method, since a relatively thick solder layer is formed uniformly, a pitch between leads of an electronic part can be finer.

Also, it is desirable that a preparatory solder layer be formed on pads of a circuit board by applying a paste-like composition containing a lead salt of an organic acid and tin powder on a pad array portion of the circuit board and thereafter heating the paste-like composition. In other words, the above-described solder precipitation reaction is utilized also in the step of forming a preparatory solder layer. As a result, a preparatory solder layer can be formed in accordance with a fine wiring pattern. In this embodiment, for example, forming a relatively thick preparatory solder layer on pads in a uniform thickness, a paste-like composition containing a lead salt of an organic acid and tin powder is applied thereon. Further, an electronic part is set on the paste-like composition, and then the composition is heated, thereby soldering the pads with leads of an electronic part. Alternatively, a preparatory solder layer can be formed by electroless plating, since electroless plating also enables a preparatory solder layer to be formed on pads in accordance with a fine wiring pattern, without forming bridges between adjacent pads.

Further, although a paste containing a lead salt of an organic acid and tin powder is applied on pads after forming a preparatory solder layer on pads, the paste can be applied on leads of an electronic part elements which are to be mounted on the pads.

Furthermore, it is possible that, forming preparatory solder layers on pads of a circuit board, the above-mentioned paste is applied to leads of an electronic part and heat it, to form preparatory solder layers also on surfaces of the leads and thereafter a flux is applied to at least one of the pads and the leads, and subsequently the pads and the leads be heated and soldered. In the case where the preparatory solder layers are formed on leads of an electronic part, it is also desirable that the above-described method of precipitating solder or an electroless plating method be employed.

A second embodiment of the method of mounting an electronic part on pads comprises the steps of applying a paste-like composition containing a lead salt of an organic acid and tin powder on a pad array portion of a circuit board, heating the paste-like composition, thereby forming a solder layer substantially only on pads, the solder layer being formed of a Sn-Pb alloy by an amount necessary for mounting an electronic part on pads, applying a flux on the solder layer, putting an electronic part on the flux, and heating and melting the solder layer, thereby soldering leads of the electronic part on the pads.

The flux can be applied also on the surfaces of leads of an electronic part. In other words, the flux may be applied to at least one of the solder layers on the pads and the surfaces of leads.

In this embodiment, the solder layer is formed in the same manner as described above, by an amount necessary for mounting electronic parts on the pads. Since no preparatory solder layer is formed unlike in the first embodiment, an electronic part can be mounted on the pads in the smaller number of steps than in the first embodiment.

If a non-halogen type flux is used, it is unnecessary to clean the circuit board after soldering, or at least, it is possible to clean it with cleaner other than freon. Thus, the present invention contributes to the prevention of atmospheric pollution which is much talked about.

If a circuit board has pad array portions including a small-pitch portion of a pad pitch of 0.5 mm or smaller and a large-pitch portion of a larger pitch, the following method can be applied.

First, a solder layer having a thickness of, for example, several ten microns (by the amount necessary for soldering) is formed on the small pitch portion, whereas a preparatory solder layer of about 5 to 10 $\mu$m thick is formed on the large pitch portion. Then, a soldering paste is printed on the preparatory solder layer on the large pitch portion, and an electronic part is provisionally fixed to the pad array portion by adhesion of the cream solder. Thereafter, the circuit board is heated in a reflow furnace or the like, thereby soldering the electronic part with the pads. On the other hand, a solder flux is applied on the pads on which the solder layers having a thickness of several ten μm required soldering by the above-mentioned method, and an electronic part is provisionally fixed to the pads by adhesion of the flux. Thereafter, the circuit board is heated in a reflow furnace or the like, thereby soldering the electronic part with the pads.

Further, individual pad array portions may require solder layers of largely different thicknesses because of different areas of pads or pad pitches. In this case, the paste-like composition is applied on each pad array portion by different amounts corresponding to the required thicknesses, and thereafter heated. Thus, solder layers of different thicknesses can be formed respectively on the pad array portions.

Figure 2:
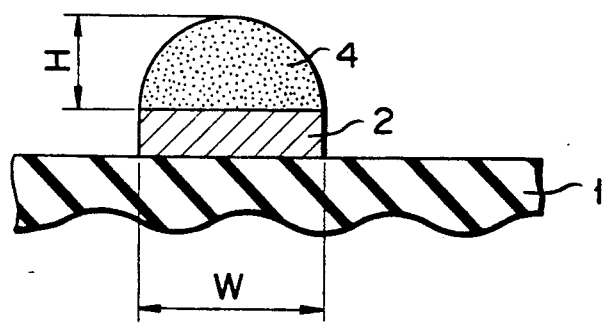
FIG. 2 is a sectional view showing a pad on which a solder layer having a half circle-like section.

On the other hand, a solder layer forming in several ten μm thick sometimes has a half circle-like section, as shown in FIG. 2. In this case, an electronic part can not be provisionally fixed exactly to the pad by only adhesion of a solder flux, if a lead of the electronic part is put on the solder layer. That is, sometimes, displacement between pads and leads can not be entirely prevented.

In FIG. 2, reference numeral 1 is an electric insulating substrate, 2 is a pad, and 4 is a solder layer, H is a thickness of the solder layer and W is a width of the pad.

This problem can be overcome by following procedure. Solder layer having a large thickness, for example, several ten μm thick is precipitated on a pad having a small area or a small pitch, thereafter, pressure is applied to the solder layer from an upper surface, thereby making the surface of the solder layer flat. In this flattening step, it is effective that pressure is applied to the solder layer is applied pressure while the layer is heated, when the solder layer has a specified thickness and width. The temperature of this depends on the solder composition, having a small area or a small pitch but it is desirable that the solder layer be heated at a temperature which is 20 to 40° C. lower than that at which the precipitated solder is deformed. The pressure and the period of time required for flattening the projections are determined in accordance with the thickness and area of the solder layer. Thus, displacement of parts can be prevented with a simple process.

When an electronic part is mounted by the first embodiment, electronic parts can be soldered with pads at a lower temperature than in a case where a conventional soldering paste is used. This advantage is very prominent particularly in a case where a solder alloy having a Pb rich composition of a high melting point is used.

For example, to manufacture an IC device such as a PGA (pin grid array) packaged by plastic or a multichip module, if an IC chip is to be soldered to a circuit in a package by a bump formed of a solder alloy having a Pb rich composition, it is desirable that the bump be formed on the circuit board rather than on the IC chip. The reason for this is that, if a bump is formed on the circuit board, an IC device can be manufactured at a low cost, not adversely affecting the IC chip. However, to form a bump on the circuit board, the circuit board must be resistant to heat which is applied thereto for forming a solder layer having a Pb rich composition of a high melting point. For this reason, an expensive substrate material resistant to a high temperature is required, resulting in a high cost in total.

In the conventional soldering method using a soldering paste, it is necessary to heat the solder at a temperature which is 30 to 60° C higher than the melting point of the solder. This is because diffusion of Cu atoms from the pad to the solder layer and diffusion of Pb and Sn atoms from the solder to the pad must be performed within a short period of time while the solder is being melted.

According to the present invention, soldering can be performed at substantially the same solder precipitating temperature no matter what the Sn/Pb ratio of a solder layer formed would be, by appropriately selecting the composition ratio between a lead salt of an organic acid and tin powder in the above paste-like composite material. For example, in the case of a Pb rich solder having a high melting point, a solder layer can be formed at a temperature much lower than the melting point of the solder formed by precipitation. Further, since an intermetallic compound layer is formed by diffusion between the solder and the copper which is a material of the pad at formation of the solder layer, additional energy, which is needed in the conventional electrical plating method, is no longer required for forming an intermetallic compound by a post-heating method, for example, fusion, when soldering is performed later using the solder layer. Thus, the number of the steps can be decreased, reducing the cost of the overall process.

The method of forming a solder layer on pads of a circuit board and the method of mounting an electronic part on a circuit board according to the present invention are applied to, for example, a circuit board as is shown in FIG. 1. In FIG. 1 reference numeral 1 is an electric insulating substrate, and pads 2 for mounting electronic parts are formed thereon. Pad array portions 3 each of in which the pads 2 are arranged

EXAMPLES

Examples of the present invention will be described below.

EXAMPLE 1

The following is an example of the method of forming a solder layer.

46% (by weight) of a lead salt of an organic acid, 18% of an activator, 25% of tin powder, and 11% of a viscosity modifier were mixed, thereby forming a paste-like composition of viscosity of about 280,000 to 290,000 cps. The paste-like composition was applied to the thickness of 0.5 mm on a pad array portion on a circuit board for incorporating a 284-pins QFP of a pad size of 0.26 mm×2 mm and a pad pitch of 0.36 mm. Then, the circuit board was heated for two minutes at the temperature of 215° C. Observing the paste-like composition, it was confirmed that the paste-like composition was liquefied, but spread little and accumulated stratifiedly on and near the pads array portion, and the tin powder was settled in the accumulated liquid, and solder layers were gradually formed on the pads. The solder layers ultimately formed on the pads have an average thickness of 9 to 10 μm with a dispersion o of about 1 to 2 μm. The solder layers contain 64 to 69% by weight of Sn. No bridges were formed in the layer.

In the same manner, solder layers were formed on pads on a pad array portion of the pad pitch of 0.15 mm, with no bridges.

As a comparative example, solder layers were formed on pads under the same condition as mentioned above by the conventional hot-gas leveling method, in a manner such that no bridges were formed. The solder layer ultimately formed has a thickness of 1 to 5 μm. Thus, the thickness has a large dispersion, and the intermetallic compound layers exposed from thinner portions of the solder layers. When a large amount of solder was applied on the pads to form a thicker layer, a large number of bridges were formed.

Next, on the assumption that parts are mounted on both sides of a circuit board, a several samples were prepared to check the wettability of solder, before and after heating, before heating (on the assumption first mounting) and after heating (on the assumption second mounting which was performed on the rear-surface of the board after first mounting).

The samples are as follows:

A: A board on which solder layers were formed by the method of present invention. The board was of a 0.3 mm thick copper plate and a solder layer. The solder layer was formed by applying a paste-like composition (containing 37 % of a lead salt of an organic acid, 10% of an activator, 40% of tin powder, 13% of a viscosity modifier) on the copper plate to a thickness of 300 μm, and thereafter heating the plate on a hot plate for two minutes at a temperature of 220° C.

B: The same board as A. The solder layer was formed by the hot gas leveling method.

C: A 0.3 mm thick copper plate with no solder layer.

Five pieces of each of samples A to C were prepared, and a non-halogen type soldering paste was applied thereon. Then, all pieces were heated, and thereafter the solder spreading ratio was measured on the basis of JIS (Japanese Industrial Standard) Z3197.

Next, the samples A to C (five pieces for each) were heated in a hot air dryer at the temperature of 150° C. for an hour. Then, the non-halogen type soldering paste was applied thereon, and thereafter the solder spreading ratio was measured.

The results of the tests are indicated Table 1 below.

TABLE 1

| | Sample | Solder spreading ratio |
|---|---|---|
| | | average |
| before heating | A | 92.6% |
| | B | 90.8 |
| | C | 90.3 |
| after heating | A | 91.0% |
| | B | 86.0 |
| | C | 84.1 |

As is obvious from Table 1, the solder layer according to the present invention keeps a high solder spreading ratio (wettability), even after subjected to heating on the assumption second mounting of an electronic part. Thus, the paste-like composition of the present invention is suitable for a preparatory solder for use in a case where electronic parts are soldered to both sides of a circuit board.

EXAMPLE 2

The following is an example of the method of soldering an electronic part on a circuit board according to the first embodiment.

46% (by weight) of a lead salt of an organic acid Pb, 18% of an activator, 25% of tin powder, and 11% of a viscosity modifier were mixed, thereby forming a paste-like composition of viscosity of about 280,000 to 290,000 cps. The paste-like composition was applied to the thickness of 0.5 mm on all over a pad array portion of a circuit board, for mounting 284-pins QFP, having a pad size of 0.26 mm × 2 mm and a pad array pitch of 0.36 mm. Then, the circuit board was heated for two minutes at the temperature of 215° C., thereby forming a preparatory solder layer on the pad array portion. The preparatory solder layer has an average thickness of 9 to 10μm with a dispersion o of about 1 to 2 μm, and contains 64 to 69% by weight of Sn. No bridges were formed.

Thereafter, a paste-like composition containing 40% of a lead salt of an organic acid, 33% of an activator, 18.4% of tin powder, and 8.6% of a viscosity modifier was applied on all over the preparatory solder layer on the pad array portion. A 284-pins QFP of the lead pitch of 0.36 mm was provisionally fixed to the paste-like composition. Then, the circuit board was heated in a reflow furnace at the temperature of 215° C. for 30 seconds, and subsequently at the temperature of 220° C. for 2 minutes, thereby precipitating solder. By using the solder, the 284-pins QFP was soldered to the pad array. As a result, no bridges were formed, and leads of the 284-pins QFP were satisfactorily soldered to the pad array.

EXAMPLE 3

The following is a example of the method of soldering an electronic part on a circuit board according to the second embodiment.

Parts which were to be soldered on a circuit board are as follows.

1) A QFP having 100 pins. The lead pitch thereof is 0.65 mm, and the entire size thereof is 20 mm × 13 mm 2) A chip of the entire size of 4.2 mm × 7 mm 3) A SOP having 20 pins. The lead pitch thereof is 0.8 mm, and the entire size thereof is 9 mm × 8 mm.

First, a glass epoxy board sized 200 mm × 250 mm was prepared, on which pads corresponding to the above three elements were formed. Pads for the QFP were sized 0.5 mm × 2 mm, pads for the chip sized 1.5 mm × 1.5 mm, and pads for the SOP sized 1.2 mm × 0.8 mm.

A paste-like composition used in this example contains 40% of a lead salt of an organic acid, 33% of an activator, 18.4% of tin powder, and 8.6% of a viscosity modifier. The paste-like composition was applied on the pad array portion in a ratio of 0.5 to 0.9 g per one pad array portion. Then, the circuit board was heated in a reflow furnace having a far infrared radiation heater at the temperature of 215° C. for 30 seconds, and subsequently at the temperature of 220° C. for 2 minutes, thereby precipitating solder. As a result, a solder layer of the thickness of 30 μm containing 74% by weight of Sn was formed.

Then, a rosin flux (Microsolder F-40 produced by HARIMA CHEMICALS, INC.) having an aqueous solution resistance of 100,000 Ω. cm or more was painted on the layer. The above-mentioned parts were put on the flux, and the board was heated in a reflow furnace to melt the solder, thereby soldering leads of each part to the pad array portion.

As a result, the leads were soldered to the pad array with no bridges and solder balls. Moreover, after the soldering, an ionicity residue was measured by means of an omegameter (Model 600 produced by KENKO Corporation, U.S.A.) without cleaning the solder layer.

The measured value was satisfactorily smal, i.e., 0.1 to 0.3 µg NaCl/sq.in.

In this example, the solder precipitation amount depends on the amount of the Sn powder settled on and around the pads, unlike the case of the conventional soldering paste. In more detail, the thickness H of the solder precipitated on the pads and the width W of the pads have a relationship shown in FIG. 3. When the relationship is represented as H=aW, the range of value a must be 0.05>a>0.5, more preferably layer will have, regionally, one or several recesses (the sections where extremely less solder is settled), affecting formation of fillet which is required for soldering. If a >0.5, the solder layer will have regionally one or several raised sections which might interferes with the lead of the electronic part to be displaced.

EXAMPLE 4

The following is an example of the method of forming a solder layer having Pb rich composition, before mounting electronic elements on a circuit board.

(1) A paste-like composition containing 67% of a lead salt of an organic acid, 10% of an activator, 13% of tin powder, and 10% of a viscosity modifier was applied on a copper plate to a thickness of 400 to 500 µm, and heated at the temperature of 220° C. for two minutes, thereby forming a solder layer. The obtained solder layer was 8 to 10 µm thick and contained Sn and Pb in the ratio 2:8, and its melting point was 293° C. When above-mentioned solder layer is formed by using the conventional soldering paste, it is required that the circuit board is dipped in a melted solder (Sn/Pb=2/8) kept in 293° C. or higher, which is far higher than 220° C. in the present invention. As a result, the reliability of the circuit board is significantly dropped.

(2) A paste-like composition containing 55% of a lead salt of an organic acid, 15% of an activator, 13% of tin powder, and 17% of a viscosity modifier was applied on a copper plate to a thickness of 300 to 400 µm, and heated at the temperature of 220° C. for two minutes, thereby forming a solder layer. The obtained solder layer was 4 to 8 µm thick and contained Sn and Pb in the ratio 3:7, and its melting point was 278° C. In the conventional method using a soldering paste containing the above-mentioned components in the same ratios, it is necessary to heat a circuit board at a temperature about 320° C.

Note that, lead naphthenate, lead rosinate, lead octylate, lead oleate, lead stearate, or the like can be used as a lead salt of an organic acid. Rosin, an organic acid, alkanolamine, amine acid, or the like can be used as an activator. Custer wax, cellulose powder, butyl carbitol, hexyl carbitol, squalene, or the like can be used as a iscosity modifier. It is desirable that tin powder is constituted by spherical grains of a diameter of 80 µm or less, preferably 25 µm or less, containing oxygen in a ratio 1500 ppm or less, preferably 1000 ppm or less, formed by an atomizing method.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming a solder layer on pads of a circuit board, comprising the steps of:
    applying a paste-like composition comprising a lead salt of an organic acid and tin powder on a pad array portion on the circuit board; and
    heating the composition to cause a solder alloy being performed in a state that a liquid pool is formed the pad array portion when the paste-like composition is liquefied by heating, and the tin powder is settled in the liquid pool.

2. The method of forming a solder layer on pads of a circuit board according to claim 1, wherein said solder layers comprise a Sn-Pb alloy having a Pb rich composition.

3. A method of mounting electronic parts on a circuit board, comprising the steps of:
    forming preparatory solder layers formed of a Sn-Pb alloy substantially only on pads of a pad array portion on the circuit board;
    applying a paste-like composition containing a lead salt of an organic acid and tin powder on the preparation solder layers;
    putting an electronic part having leads on the paste-like composition; and
    heating the composition to cause solder precipitation for forming a solder alloy, thereby soldering the pads with leads of the electronic part.

4. The method according to claim 3, wherein said preparatory solder layers are formed by applying a paste-like composition comprising a lead salt of an organic acid and tin powder on the pad array portion, and heating the paste-like composition.

5. The method according to claim 3, wherein said preparatory solder layers are formed by electroless plating.

6. The method according to claim 3, wherein said solder precipitation is performed in a state that a liquid pool is formed on the pad array portion when the paste-like composition is liquefied by heating, and the tin powder is settled in the liquid pool.

7. The method according to claim 3, wherein said solder alloy comprises a Sn-Pb alloy having Pb rich composition.

8. A method of mounting an electronic part on a circuit board, comprising the steps of:
    forming preparatory solder layers formed of a Sn-Pb alloy substantially only on pads of a pad array portion of the circuit board;
    applying a paste-like composition containing a lead salt of an organic acid and tin powder to leads of an electronic part to be soldered with the pads;
    putting the electronic part on the preparatory solder layers; and
    heating the composition to cause solder precipitation for forming a solder alloy, thereby soldering the pads with leads of the electronic part.

9. The method according to claim 8, wherein said preparatory solder layers are formed by applying a paste-like composition comprising a lead salt of an organic acid and tin powder on the pad array, and heating the paste-like composition.

10. The method according to claim 8, wherein said preparatory solder layer is formed by electroless plating.

11. The method according to claim 8, wherein said solder precipitation is performed in a state that a liquid pool is formed on the pad array portion when the paste-like composition is liquefied by heating, and the tin powder is settled in the liquid pool.

12. The method according to claim 8, wherein said solder alloy comprises a Sn-Pb alloy having a Pb rich composition.

13. A method of mounting an electronic part on a circuit board, comprising the steps of:
   forming preparatory solder layers formed of a Sn-Pb alloy substantially only on pads of a pad array portion on the circuit board;
   applying a paste-like composition comprising a lead salt of an organic acid and tin powder to leads of an electronic part to be soldered with the pads;
   heating the paste-like composition to cause solder precipitation for forming preparatory solder layers on the leads;
   applying a flux at least one of the preparatory solder layers on the pads and the preparatory solder layers on the leads;
   putting the electronic part on the preparatory solder layer on the pads; and
   heating the preparatory solder layers on the pads and the leads, thereby soldering the pads to the leads of the electronic part.

14. The method according to claim 13, wherein said preparatory solder layers on the pads are formed by applying a paste-like composition comprising a lead salt of an organic acid and tin powder, and heating the paste-like composition.

15. The method according to claim 13, wherein said preparatory solder layers on the pads are formed by electroless plating.

16. The method according to claim 13, wherein said solder precipitation is performed in a state that a liquid pool is formed on the pad array portion when the paste-like composition is liquefied by heating, and the tin powder is settled in the liquid pool.

17. The method according to claim 13, wherein said solder alloy comprises a Sn-Pb alloy having a Pb rich composition.

18. A method of mounting an electronic part on a circuit board, comprising the steps of:
   applying a paste-like composition comprising a lead salt of an organic acid and tin powder on a pad array portion on the circuit board;
   heating the paste-like composition to cause solder precipitation, thereby forming solder layers formed of a Sn-Pb alloy in an amount required for mounting an electronic part on pads of the pad array portion;
   applying a flux on at least one of the solder layer and leads of an electronic part which is to be mounted on the pads;
   putting the electronic part on the pads; and
   heating the solder layers, thereby soldering the pads to the leads of the electronic part.

19. The method according to claim 18, wherein said solder precipitation is performed in a state that a liquid pool is formed on the pad array portion when the paste-like compositionis liquefied by heating, and the tin powder is settled in the liquid pool.

20. The method according to claim 18, wherein said flux is of a non-halogen type.

21. The method according to claim 18, wherein said solder alloy comprises a Sn-Pb alloy having a Pb rich composition.

22. The method according to claim 18, further comprising the step of applying pressure to the upper surfaces of the solder layers, after the step of forming the solder layers, and before the step of putting an electronic part on the pads.

23. The method according to claim 22, wherein pressure is applied to the upper surfaces of the solder layers while heating the solder layer.

24. The method according to claim 18, wherein a relationship between the width W of the pads and the thickness H of the solder precipitated on the pads is represented by the formula $H=aW$, wherein a is $0.05>a>0.5$.

25. The method according to claim 24, wherein a is $0.1>a>0.3$.

26. The method according to claim 4, wherein said preparatory solder layers are formed by electroless plating; said solder precipitation is performed in a state whereby a liquid pool is formed on the pad array portion when the paste-like composition is liquefied by heating and the tin-powder is settled in the liquid pool; and said solder alloy comprises a Sn-Pb alloy having a Pb rich composition.

27. The method according to claim 9, wherein said preparatory solder layers are formed by electroless plating; said solder precipitation is performed in a state whereby a liquid pool is formed on the pad array portion when the paste-like composition is liquefied by heating and the tin-powder is settled in the liquid pool; and said solder alloy comprises a Sn-Pb alloy having a Pb rich composition.

28. The method according to claim 14, wherein said preparatory solder layers are formed by electroless plating; said solder precipitation is performed in a state whereby a liquid pool is formed on the pad array portion when the paste-like composition is liquefied by heating and the tin-powder is settled in the liquid pool; and said solder alloy comprises a Sn-Pb alloy having a Pb rich composition.

29. The method according to claim 23, wherein said flux is a non-halogen type; said solder alloy comprises a Sn-Pb alloy having a Pb rich composition; said solder precipitation is performed in a state whereby a liquid pool is formed on the pad array portion, liquefied by heating, and the tin powder is settled in the liquid pool; and there is a relationship between the width W of the pads and the thickness H of the solder precipitated on the pads represented by the formula $H=aW$, wherein $0.1>a>0.3$.

* * * * *

UNITED STATES PATENT AND TRADEMARK OFFICE
CERTIFICATE OF CORRECTION

PATENT NO. : 5,118,029
DATED : June 2, 1992
INVENTOR(S) : Kenichi FUSE et al It is certified that error appears in the above-identified patent and that said Letters Patent is hereby corrected as shown below:

Title page, Section [75] Inventors, third inventor, "Kohno" should be --Kono--.

Signed and Sealed this

Thirtieth Day of August, 1994

Attest:

BRUCE LEHMAN

*Attesting Officer*      *Commissioner of Patents and Trademarks*